United States Patent [19]

Iranmanesh

[11] Patent Number: 5,521,440
[45] Date of Patent: May 28, 1996

[54] LOW-CAPACITANCE, PLUGGED ANTIFUSE AND METHOD OF MANUFACTURE THEREFOR

[75] Inventor: Ali Iranmanesh, Sunnyvale, Calif.

[73] Assignee: Crosspoint Solutions, Inc., Santa Clara, Calif.

[21] Appl. No.: 248,789

[22] Filed: May 25, 1994

[51] Int. Cl.[6] .............................. H01L 23/48; H01L 23/52; H01L 29/40; H01L 31/058
[52] U.S. Cl. ........................................... 257/774; 257/467
[58] Field of Search ....................... 257/467, 774

[56] References Cited

U.S. PATENT DOCUMENTS

| | | | |
|---|---|---|---|
| 5,070,384 | 12/1991 | McCollum et al. | 257/467 |
| 5,100,827 | 3/1992 | Lytle | 437/52 |
| 5,106,773 | 4/1992 | Chen et al. | 437/51 |
| 5,191,241 | 3/1993 | McCollund et al. | 257/467 |

*Primary Examiner*—Stephen D. Meier
*Attorney, Agent, or Firm*—Townsend and Townsend and Crew

[57] ABSTRACT

An antifuse structure in an integrated circuit is provided. The antifuse structure has a first metal interconnection line and a first insulating layer over the first metal interconnection line. The first insulating layer has a via exposing a top surface of the first metal interconnection line. In the first aperture a metal plug contacts the first metal interconnection layer and has a top surface substantially coplanar with a top surface of the first insulating layer. A metal pad contacts and covers the top surface of the metal plug. The metal pad should be formed by a viscous barrier metal, such as TiW, to smooth the surface of the metal plug. A second insulating layer, relatively thin with respect to said first insulating layer, covers the metal pad and has an aperture exposing a top surface of the metal pad. A programming layer deposited over the second insulating layer and into the aperture contacts the top surface of metal pad. A second metal interconnection line rests on the programming layer. In an alternative embodiment the locations of the second insulating layer and the programming layer are reversed.

24 Claims, 3 Drawing Sheets

LOW-CAPACITANCE, PLUGGED ANTIFUSE AND METHOD OF MANUFACTURE THEREFOR

BACKGROUND OF THE INVENTION

The present invention is related to Field Programmable Gate Array (FPGA) integrated circuits and, more particularly, to antifuses in FPGAs and their manufacture.

Antifuses are found in a growing number of integrated circuits, most of which are FPGAs. As the name implies, antifuses have a very high resistance (to form essentially an open circuit) in the unprogrammed ("off") state, and a very low resistance (to form essentially a closed circuit) in the programmed ("on") state. In these integrated circuits antifuses are placed at the intersections of interconnection lines which lead to different elements of the integrated circuit. By programming selected antifuses, the interconnections between the various elements of the integrated circuit are formed to define the function of the device.

In a typical antifuse structure a programming layer, such as amorphous silicon, is sandwiched between two metal interconnection lines. Depending upon the material of a metal interconnection line, a layer of barrier metal, such as TiW (titanium-tungsten), is used as an interfacing layer of the metal interconnection line to the programming layer. Barrier metal layers function to block the undesired interdiffusion of material from the programming layer, silicon from amorphous silicon, and material from a metal layer, aluminum from aluminum alloy, for instance. Barrier metal layers are typically refractory metals, their intermetallics, alloys, silicides, nitrides and combinations thereof.

An antifuse is programmed by placing a large voltage across the two metal interconnection lines. The programming voltage is much larger than the operating voltages in the FPGA and causes the programming layer to melt to form a conducting link between the two interconnection lines.

Nonetheless, various problems have been found with present day antifuses. One problem is that the programmed resistance (RON) of the antifuses on the FPGA tends to vary widely and unpredictably, even to the point that the antifuse can be considered unprogrammed. This is undesirable because the failure of one antifuse may remove the defined function of the programmed circuit in the FPGA and the unpredictability of the resistances of the programmed antifuses also renders the performance of the FPGA to be inconsistent.

Another problem, which is believed to be related to the first problem, is that voltages to program the antifuses also tend to vary widely. Circuit and process designs must be made to accommodate these variations, which adversely affect the cost and performance of the integrated circuit incorporating these antifuses.

The present invention solves or substantially mitigates these problems. An advantage of the present invention is that the resulting antifuse has a low capacitance which allows a high performance of the FPGA. A further advantage is that the present invention can be incorporated into existing antifuse processes without radical and expensive changes.

SUMMARY OF THE INVENTION

The present invention provides for an antifuse structure in an integrated circuit. The antifuse structure has a first metal interconnection line and a first insulating layer over the first metal interconnection line. The first insulating layer has a via exposing a top surface of the first metal interconnection line. In the first aperture a metal plug contacts the first metal interconnection layer and has a top surface substantially coplanar with a top surface of the first insulating layer. A metal pad contacts and covers the top surface of the metal plug. The metal pad should be formed by a viscous barrier metal, such as TiW, to smooth the surface of the metal plug. A second insulating layer, relatively thin with respect to said first insulating layer, covers the metal pad and has an aperture exposing a top surface of the metal pad. A programming layer deposited over the second insulating layer and into the aperture contacts the top surface of metal pad. A second metal interconnection line rests on the programming layer. In an alternative embodiment the locations of the second insulating layer and the programming layer are reversed.

This antifuse structure has low capacitance since the capacitor area is primarily defined by the aperture which is easily defined. The programming voltage is consistent since the metal plug avoids the deposition of the programming layer into the deep via and the programming layer is fairly flat for an even deposition.

The present invention also provides for a method of forming an antifuse in an integrated circuit having a first insulating layer on a semiconductor substrate. The method has the steps of: forming a first metal interconnection line on the first insulating layer; forming a relatively thick, first insulating layer over the first metal interconnection line; forming a via through the first insulating layer to expose a top surface of the first metal interconnection line; forming a metal plug in the via in contact with the first metal interconnection line with the metal plug having a top surface substantially coplanar with the top surface of the first insulating layer; forming a metal pad over the top surface of the metal plug; forming a relatively thin, second insulating layer on the first insulating layer and the metal pad, the second insulating layer with an aperture exposing the top surface of the metal pad; forming a programming layer on the second insulating layer and in the aperture to contact the metal pad; and forming a second metal interconnection layer on the programming layer. Alternatively, the forming steps for the second insulating layer and the programming layer may be reversed.

BRIEF DESCRIPTION OF THE DRAWINGS

A more detailed understanding of the present invention may be achieved by perusing the following Detailed Description Of Preferred Embodiments of the present invention with reference to the following drawings.

DETAILED DESCRIPTION OF PREFERRED EMBODIMENTS

At least one of the reasons for the variation in programmed resistance, $R_{ON}$, and programming voltages in present day antifuse structures is believed to be the irregularities in the programming layer between the two metal interconnection lines. For example, a protrusion into the programming layer by one of the interconnection lines creates a point of high electric fields during the programming of the antifuse. The likelihood of a breakdown of the programming layer at this location is high; however, process control over the thickness of the programming layer at this point is uncertain. Therefore, the conducting link formed at this location has an uncertain resistance and the programming voltage is uncertain. Likewise, there is a similar result if the programming layer is not formed evenly, such as the formation of folds in the programming layer. Ideally, the programming layer should have an even thickness. To achieve that end, the layer should have a flat, or at least a well-rounded, contour between the two metal interconnection lines. The present invention forms the programming layer with flat contours. Additionally the resulting antifuse structure has a small capacitance so that the unprogrammed antifuses do not hinder the performance of the FPGA unduly.

Figure 1A:
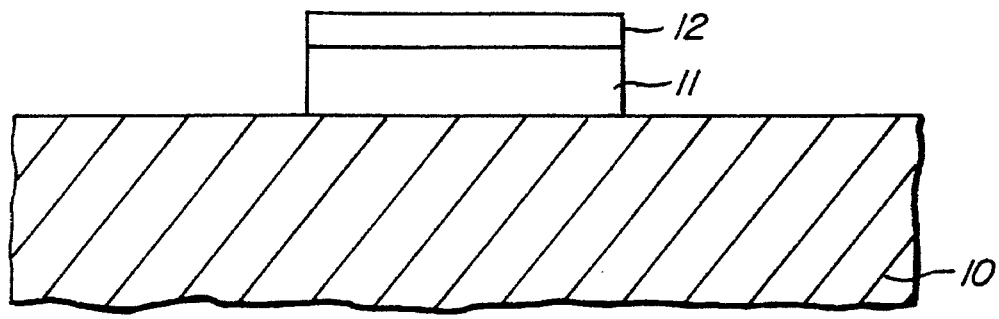
FIGS. 1A–1E illustrate a sequence of steps used to manufacture an antifuse structure according to one embodiment of the present invention.
Figure 1B:
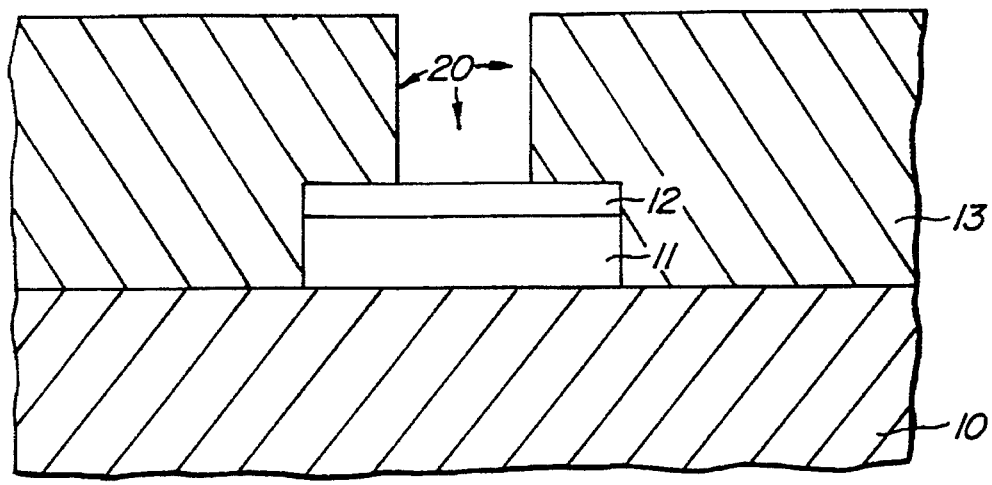

The process steps for manufacturing an antifuse structure according to one embodiment of the present invention are illustrated in FIGS. 1A–1E. It should be understood that the described antifuse structure is formed by process steps after the creation of the transistors and other integrated circuit elements which are formed at the surface of a semiconductor substrate. FIG. 1A illustrates a first metal interconnection line formed by an aluminum layer 11 and an overlying barrier metal layer 12 of TiW. The first metal interconnection line is formed by standard deposition, photolithographic and etching techniques on an insulating layer 10 of silicon dioxide which has been deposited over a semiconductor substrate (not shown) of the integrated circuit.

After the definition of the first metal interconnection line, a thick insulating layer 13 of silicon dioxide is deposited over the first metal interconnection line and the insulating layer 10. The layer 13 forms the interlayer dielectric between the first and second metal interconnection lines and the techniques for forming such layers are well-known to semiconductor process engineers. The layer 13 is formed between 5000–15,000 Å thick. Then where an antifuse is to be formed (or a standard contact between the first and second metal interconnection lines), a via 20 is defined and anisotropically etched through the layer 13 to the top surface of the barrier metal layer 12. Techniques for forming the via 20 are well-known.

Then, a thick metal layer of tungsten is deposited in a blanket over the layer 13 and into the via 20. The layer is then etched back so that the top of the tungsten layer is nearly level with the top surface of the insulating layer 13 so that a plug 14 of tungsten is formed in the via 20. A thin layer of titanium tungsten alloy or titanium nitride may be deposited prior to the deposition of the tungsten layer to act as a nucleating and adhesion layer for the tungsten layer which forms the plug 14. Alternatively, selective deposition techniques into the via 20 by chemical vapor deposition and other deposition techniques, such as electroplating, may be used to fill the via 20 to form the plug 14. Besides tungsten, copper, aluminum, or other suitable metals may also be used for the plug 14. Processes to form refractory metal plugs in antifuse structures are discussed in U.S. Pat. No. 5,233,217, which issued Aug. 3, 1993 to Pankaj Dixit et al., and assigned to the present assignee.

Figure 1C:
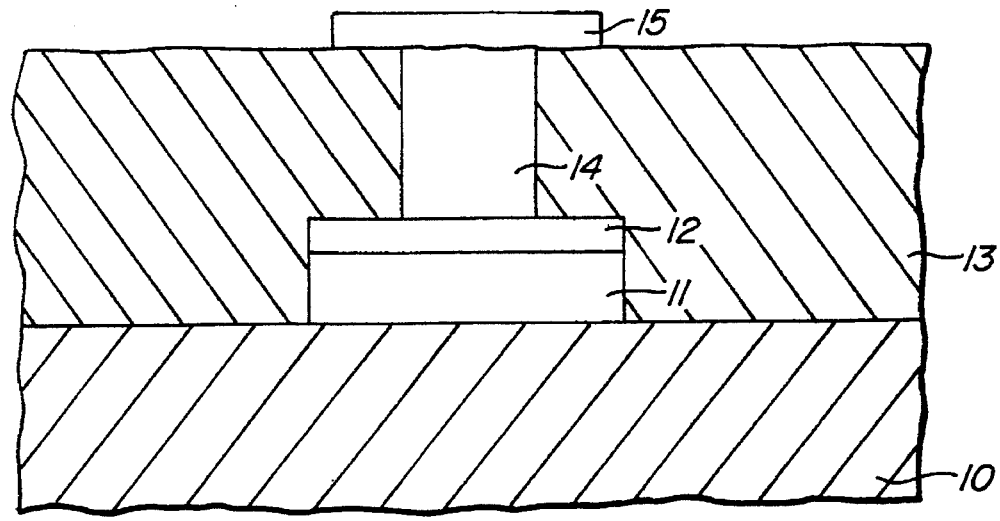

A thin refractory metal layer 15 is then sputtered over the plug 14 and the surface of the insulating layer 13. It has been found that such a refractory metal layer which is viscous, such as titanium-tungsten, titanium nitride, or molybdenum silicide, is highly beneficial for the operation of the antifuse. The viscous barrier metal layer 15 smooths any irregularities which might be found on the top surface of the plug 14. In the particular embodiment described, the layer 15 is formed from TiW with a thickness from 500–1500 Å. As shown in FIG. 1C, the viscous barrier metal layer 15 is defined over the plug 14 by well-known photolithographic and etching techniques.

Figure 1D:
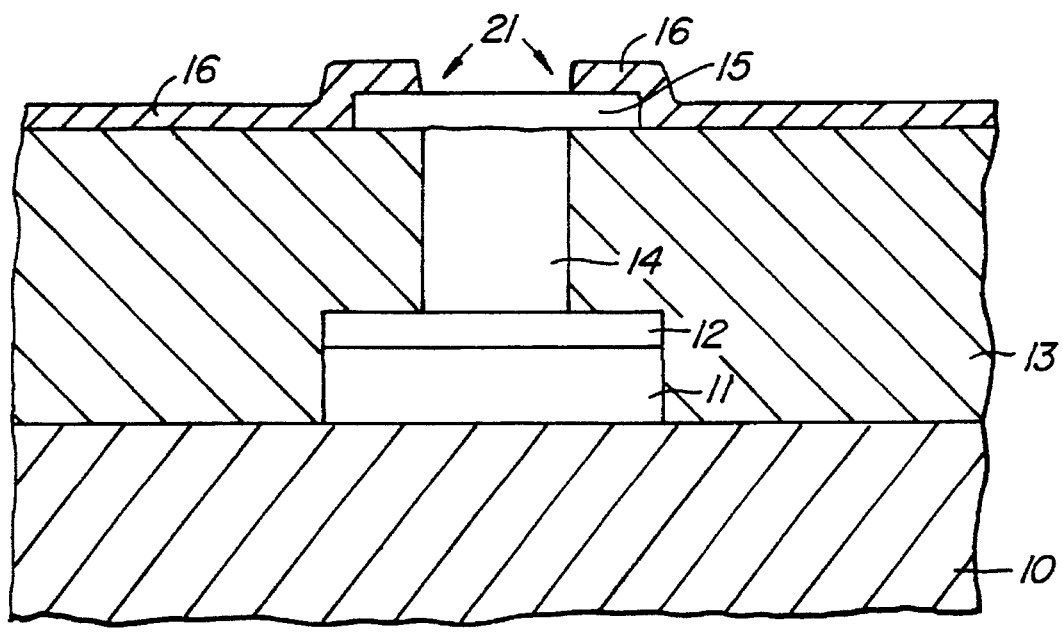

Then, a relatively thin insulating layer 16 of silicon dioxide is deposited over the top surface of the insulating layer 13 and viscous barrier metal layer 15. The deposition is typically performed by a chemical vapor deposition to a thickness between 1500–2500 Å, with approximately 2000 Å preferable. As shown in FIG. 1D, an aperture 21 is formed through the layer 16 to expose a portion of the top surface of the metal layer 15.

A programming layer 17 of amorphous silicon is deposited over the layer 16 and into the aperture 21 by plasma-enhanced chemical vapor deposition. The programming layer 17 has hydrogen in the range from 8–20% by atomic weight and is formed to a thickness of 300 to 500 Å, with 400 Å considered optimum. Then, a barrier metal layer 18 of TiW is deposited. This is followed by an aluminum alloy layer 19. By standard photolithographic and etching steps, the layers 18 and 19 are then defined to form the second metal interconnection line, as shown in FIG. 1E.

Figure 1E:
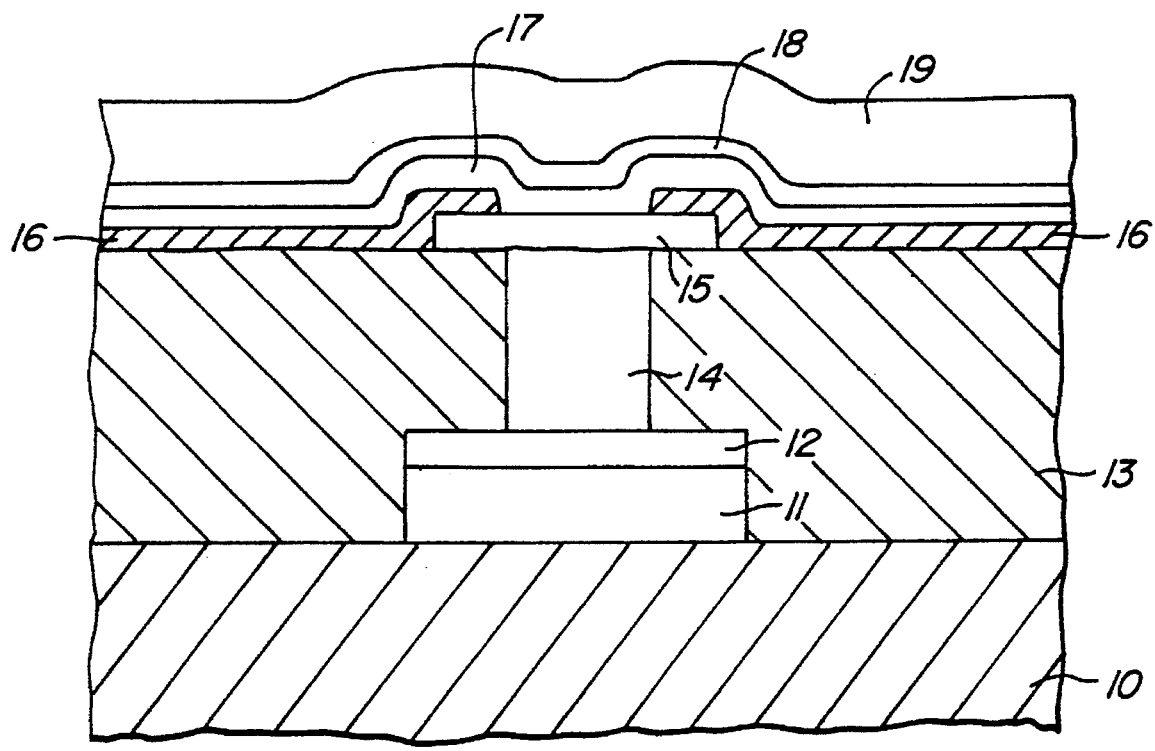

The antifuse structure, illustrated in FIG. 1E, has the advantage that the programming layer 17 can be formed with a uniform thickness, since the insulating layer 16 is relatively thin and the aperture 21 is relatively shallow. This permits a uniform deposition of the programming layer 17 into the aperture 21. Furthermore, the two metal interconnection lines form two plates of the capacitor in an unprogrammed antifuse. The aperture 21 defines the area of the antifuse structure which defines most of the capacitive coupling of the antifuse. This area is small, and hence lowers the capacitive coupling of the unprogrammed antifuse which, in turn, lessens the RC time constants of the first and second metal interconnection lines.

Figure 2A:
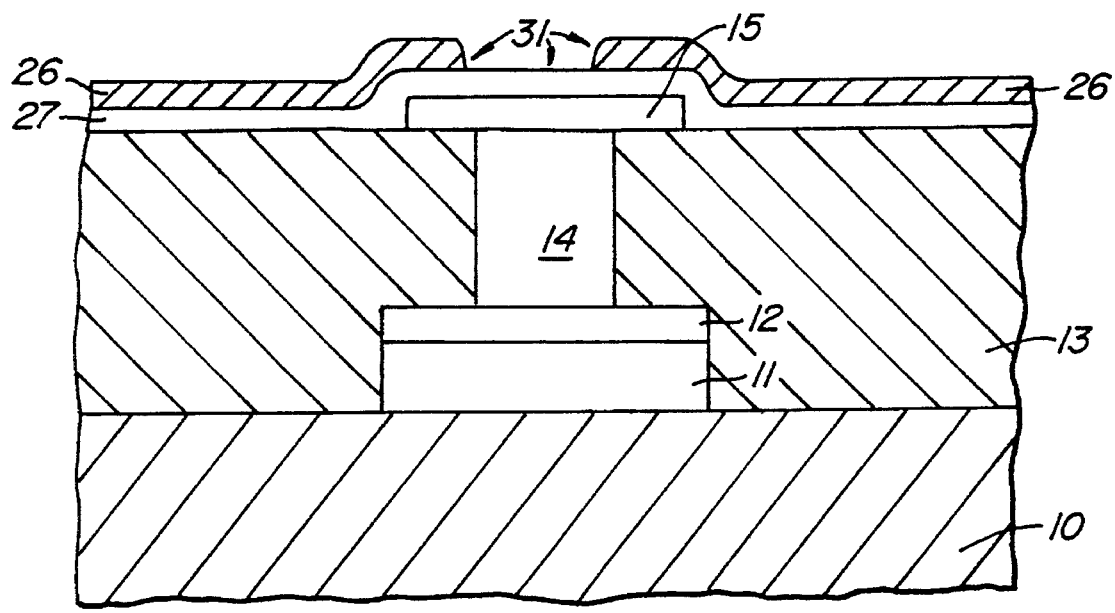
FIGS. 2A–2B illustrate a sequence of steps used to manufacture an antifuse structure according to another embodiment of the present invention.
Figure 2B:
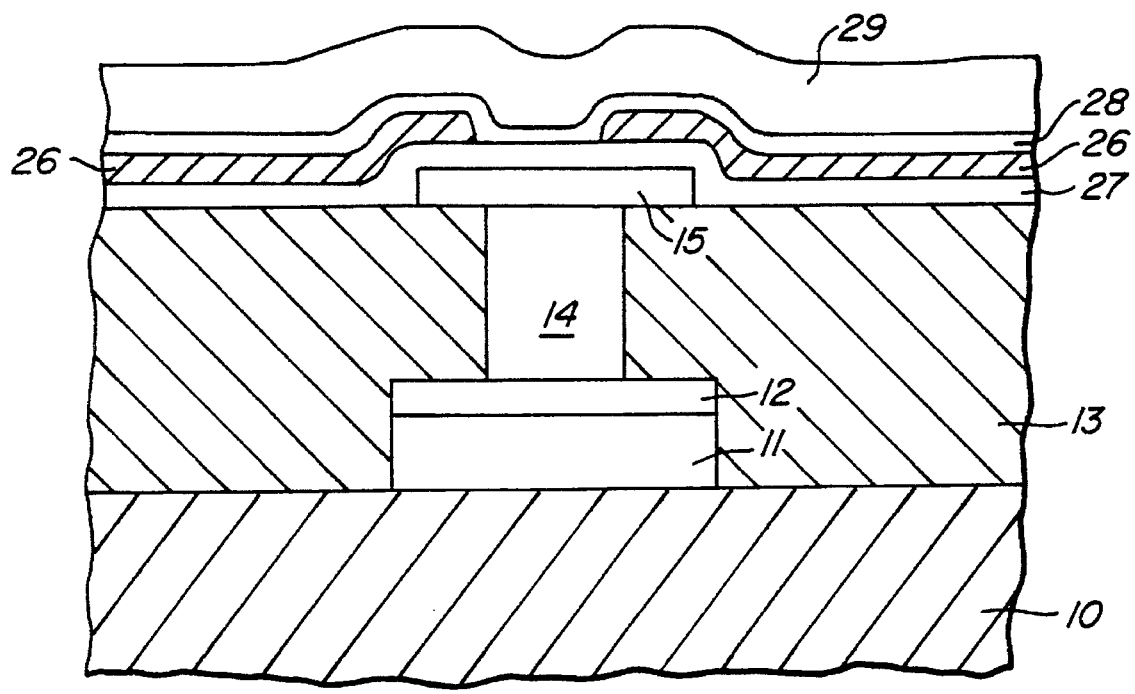

For an even more uniform and controlled thickness of the programming layer, the present invention has an alternative embodiment, as illustrated in FIGS. 2A and 2B. In this embodiment the location of the programming layer and the thin insulating layer are reversed. After the step shown in FIG. 1C, a programming layer 27 of amorphous silicon is deposited over the viscous barrier metal layer 15 and the insulating layer 13, instead of a thin insulating layer. A relatively thin insulating layer 26 follows the programming layer 27 and is deposited over the layer 27. An aperture 31 is then formed in the insulating layer 26, as in the case of the aperture 21 for the insulating layer 16 illustrated in FIG. 1D.

A TiW barrier metal layer 28 is deposited over the insulating layer 26 and into the aperture 31. This is followed by the deposition of an aluminum alloy layer 29. The second metal interconnection line is then formed by the definition of the layers 28 and 29. The resulting antifuse structure has the advantage that the capacitance-defining area is still set by the aperture 31 created in the relatively thin insulating layer 26. Additionally, the programming layer is not deposited in the aperture 31, even though shallow, but is rather deposited over the top surface of the plug capping layer 15. This allows the thickness of the programming layer 27 to be deposited more uniformly and consistently.

While amorphous silicon was used for the programming layer of the antifuse, other materials, such as silicon dioxide and silicon nitride, may also be used. Multiple layers may also be used in place of a single programming layer. For example, other structures may include silicon dioxide/silicon nitride/silicon dioxide, silicon nitride/silicon dioxide/silicon nitride, other silicon dioxide/silicon nitride layer combinations, silicon/silicon dioxide/silicon, silicon/silicon nitride/silicon dioxide/silicon and other silicon/silicon dioxide/silicon nitride combinations.

It should be noted that for a standard contact between the first and second metal interconnection lines, the programming layer 17 is removed from the described antifuse structures. This can be done by etching a via through the programming layer at standard contact locations so that the second metal interconnection line directly contacts the barrier metal layer 15 or by etching the programming layer 17 so that it remains only at antifuse locations.

While the above is a complete description of the preferred embodiments of the invention, various alternatives, modifications and equivalents may be used. It should be evident that the present invention is equally applicable by making appropriate modifications to the embodiments described above.

What is claimed is:

1. An antifuse structure in an integrated circuit comprising a first metal interconnection line;

a first insulating layer over said first metal interconnection line, said first insulating layer having a first aperture exposing a top surface of said first metal interconnection line;

a metal plug in said first aperture, said metal plug contacting said first metal interconnection layer and having a top surface substantially coplanar with a top surface of said first insulating layer;

a metal pad in contact with and covering said top surface of said metal plug, said metal pad having a periphery substantially coextensive with a periphery of said metal plug;

a second insulating layer over said metal pad, said second insulating layer being thin with respect to said first insulating layer, said second insulating layer having a second aperture exposing a top surface of said metal pad;

a programming layer over said second insulating layer and in said second aperture to contact said top surface of metal pad; and a second interconnection line over said programming layer;

whereby said antifuse structure has a low capacitance and a consistent programming voltage.

2. The antifuse structure of claim 1 wherein said metal pad comprises a viscous barrier metal.

3. The antifuse structure of claim 2 wherein said metal pad comprises TiW.

4. The antifuse structure of claim 2 wherein said metal pad comprises TiN.

5. The antifuse structure of claim 2 wherein said metal pad comprises $MoSi_2$.

6. The antifuse structure of claim 1 wherein said programming layer comprises amorphous silicon.

7. The antifuse structure of claim 1 wherein said metal plug comprises tungsten.

8. The antifuse structure of claim 1 wherein said metal plug comprises aluminum.

9. The antifuse structure of claim 8 wherein said first metal interconnection line comprises an aluminum layer and a barrier metal layer between said aluminum layer and said metal plug.

10. The antifuse structure of claim 1 wherein said second metal interconnection line comprises an aluminum layer, and a barrier metal layer between said programming layer and said metal plug.

11. The antifuse structure of claim 1 wherein said first insulating layer is from 5000 to 15000 Å thick and said second insulating layer is 500 to 3000 Å thick.

12. The antifuse structure of claim 1 wherein said metal pad comprises a smooth top surface.

13. An antifuse structure in an integrated circuit comprising a first metal interconnection line;

a first insulating layer over said first metal interconnection line, said first insulating layer having a first aperture exposing a top surface of said first metal interconnection line;

a metal plug in said first aperture, said metal plug contacting said first metal interconnection layer and having a top surface substantially coplanar with a top surface of said first insulating layer;

a metal pad in contact with and covering said top surface of said metal plug, said metal pad having a periphery substantially coextensive with a periphery of said metal plug;

a programming layer over said metal pad;

a second insulating layer over said programming layer, said second insulating layer relatively thin with respect to said first insulating layer, said second insulating layer having a second aperture over said metal pad and exposing a top surface of said programming layer; and a second interconnection line over said second insulating layer and in said second aperture to contact said programming layer;

whereby said antifuse structure has a low capacitance and a consistent programming voltage.

14. The antifuse structure of claim 13 wherein said metal pad comprises a viscous barrier metal layer.

15. The antifuse structure of claim 14 wherein said metal pad comprises TiW.

16. The antifuse structure of claim 14 wherein said metal pad comprises TiN.

17. The antifuse structure of claim 14 wherein said metal pad comprises $MoSi_2$.

18. The antifuse structure of claim 13 wherein said programming layer comprises amorphous silicon.

19. The antifuse structure of claim 13 wherein said metal plug comprises tungsten.

20. The antifuse structure of claim 13 wherein said metal plug comprises aluminum.

21. The antifuse structure of claim 13 wherein said second metal interconnection line comprises an aluminum layer and a barrier metal layer between said aluminum layer and said programming layer.

22. The antifuse structure of claim 21 wherein said first metal interconnection line comprises an aluminum layer and a barrier metal layer between said aluminum layer and said metal plug.

23. The antifuse structure of claim 13 wherein said first insulating layer is from 5000 to 15000 Å thick and said second insulating layer is 500 to 3000 Å thick.

24. The antifuse structure of claim 13 wherein said metal pad comprises a smooth top surface.

* * * * *